(12) United States Patent
Murphy

(10) Patent No.: US 9,404,372 B2
(45) Date of Patent: Aug. 2, 2016

(54) PT-AL-HF/ZR COATING AND METHOD

(71) Applicant: Kenneth S. Murphy, Norton Shores, MI (US)

(72) Inventor: Kenneth S. Murphy, Norton Shores, MI (US)

(73) Assignee: Howmet Corporation, Whitehall, MI (US)

( * ) Notice: Subject to any disclaimer, the term of this patent is extended or adjusted under 35 U.S.C. 154(b) by 826 days.

(21) Appl. No.: 13/694,124

(22) Filed: Oct. 31, 2012

(65) Prior Publication Data

US 2014/0134447 A1    May 15, 2014

Related U.S. Application Data

(62) Division of application No. 12/800,597, filed on May 18, 2010.

(60) Provisional application No. 61/216,649, filed on May 20, 2009.

(51) Int. Cl.
| | |
|---|---|
| B32B 15/01 | (2006.01) |
| C22C 21/00 | (2006.01) |
| C23C 16/12 | (2006.01) |
| F01D 5/28 | (2006.01) |
| C22C 5/04 | (2006.01) |
| C22C 16/00 | (2006.01) |
| C22C 27/00 | (2006.01) |
| C23C 10/52 | (2006.01) |
| C23C 16/14 | (2006.01) |

(52) U.S. Cl.
CPC ............... *F01D 5/288* (2013.01); *B32B 15/01* (2013.01); *B32B 15/018* (2013.01); *C22C 5/04* (2013.01); *C22C 16/00* (2013.01); *C22C 21/00* (2013.01); *C22C 27/00* (2013.01); *C23C 10/52* (2013.01); *C23C 16/12* (2013.01); *C23C 16/14* (2013.01); *Y10T 428/12* (2015.01); *Y10T 428/12736* (2015.01)

(58) Field of Classification Search
USPC .......................................................... 428/680
See application file for complete search history.

(56) References Cited

U.S. PATENT DOCUMENTS

| | | | |
|---|---|---|---|
| 4,086,391 A | 4/1978 | Giggins et al. | 428/679 |
| 5,295,530 A | 3/1994 | O'Connor et al. | 164/516 |
| 5,462,013 A | 10/1995 | Punola et al. | 118/719 |
| 5,716,720 A | 2/1998 | Murphy | 428/623 |
| 5,725,691 A | 3/1998 | Liu | 148/409 |
| 5,837,385 A | 11/1998 | Schaeffer et al. | 428/610 |
| 5,856,027 A | 1/1999 | Murphy | 428/623 |
| 5,989,733 A | 11/1999 | Warnes et al. | 428/652 |
| 6,255,001 B1 | 7/2001 | Darolia | 428/610 |

(Continued)

FOREIGN PATENT DOCUMENTS

| | | |
|---|---|---|
| EP | 1 125 702 A2 | 8/2001 |
| EP | 1 611 978 A1 | 1/2006 |

(Continued)

*Primary Examiner* — Humera Sheikh
*Assistant Examiner* — Lucas Wang

(57) ABSTRACT

A Pt—Al—Hf/Zr aluminide coating that can be used as a bond coat for TBC and improve TBC spallation life in service at elevated temperatures is provided. The aluminide coating can include a metastable ternary or higher X—Pt/Pd—Ni phase where the phase and other elements in the alloy system are present in a NiAl β phase of the coating. The metastable phase can be present and observable in the as-deposited condition of the bond coating; e.g. in an as-CVD deposited condition of the bond coating.

17 Claims, 11 Drawing Sheets

(56) References Cited

U.S. PATENT DOCUMENTS

| | | | |
|---|---|---|---|
| 6,291,014 B1 | 9/2001 | Warnes et al. | 427/252 |
| 6,332,931 B1 | 12/2001 | Das et al. | 148/240 |
| 6,344,282 B1 * | 2/2002 | Darolia et al. | 428/652 |
| 6,514,629 B1 | 2/2003 | Rigney et al. | 428/632 |
| 6,582,772 B2 | 6/2003 | Rigney et al. | 427/404 |
| 6,589,668 B1 | 7/2003 | Braithwaite et al. | 428/610 |
| 6,602,356 B1 | 8/2003 | Nagaraj et al. | 148/283 |
| 6,689,422 B1 | 2/2004 | Warnes et al. | 427/255.11 |
| 6,849,132 B2 | 2/2005 | Warnes et al. | 118/715 |
| 7,214,409 B1 * | 5/2007 | Kasule | 427/383.7 |
| 7,250,225 B2 | 7/2007 | Hazel et al. | 428/680 |
| 7,326,441 B2 | 2/2008 | Darolia et al. | 427/328 |
| 2002/0094447 A1 | 7/2002 | Spitsberg | 428/632 |
| 2003/0044633 A1 | 3/2003 | Nagaraj et al. | 628/615 |
| 2003/0118863 A1 * | 6/2003 | Darolia et al. | 428/650 |
| 2004/0197597 A1 | 10/2004 | Schaeffer | 628/633 |
| 2005/0011593 A1 | 1/2005 | Grossman et al. | 148/525 |
| 2006/0127695 A1 | 6/2006 | Gleeson et al. | 428/670 |
| 2007/0128360 A1 | 6/2007 | Gorman et al. | 427/252 |
| 2008/0000611 A1 | 1/2008 | Bunker et al. | 164/138 |
| 2008/0102306 A1 | 5/2008 | Gorman et al. | 428/632 |
| 2008/0131720 A1 | 6/2008 | Gorman et al. | 428/610 |
| 2008/0261073 A1 | 10/2008 | Maloney et al. | 428/680 |
| 2009/0126833 A1 * | 5/2009 | Cavanaugh et al. | 148/248 |

FOREIGN PATENT DOCUMENTS

| | | |
|---|---|---|
| EP | 1 616 642 A1 | 1/2006 |
| EP | 1 769 862 A1 | 4/2007 |

* cited by examiner

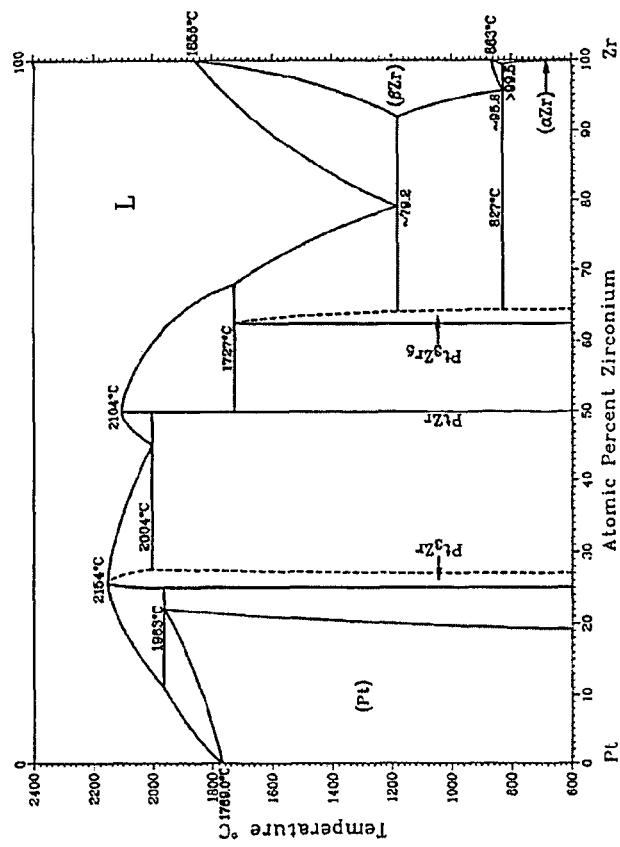
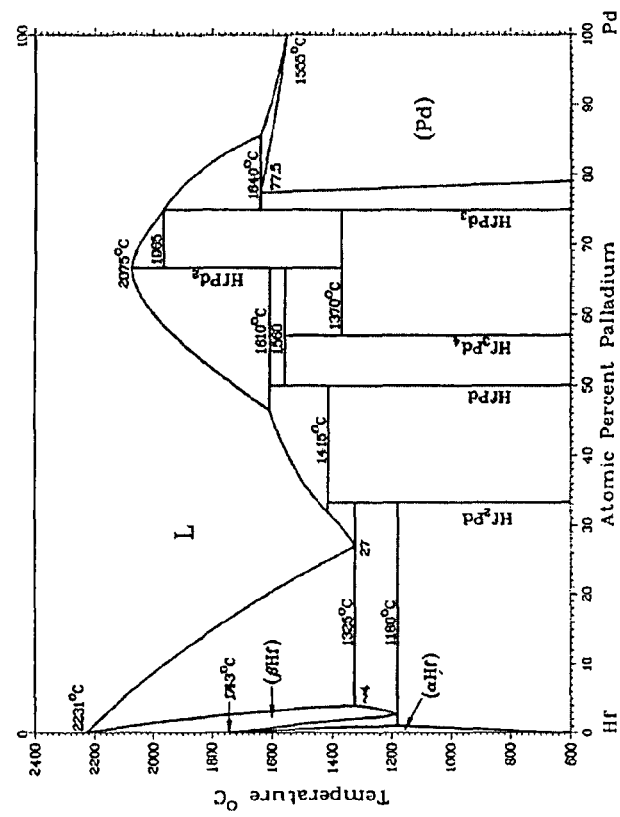
Figure 1(b)
Figure 1(a)

PT-AL-HF/ZR COATING AND METHOD

This application is a division of application Ser. No. 12/800,597 filed May 18, 2010, which claims benefits and priority of U.S. provisional application Ser. No. 61/216,649 filed May 20, 2009, the entire disclosures of both of which are incorporated herein by reference.

FIELD OF THE INVENTION

The present invention relates to Pt—Al—Hf/Zr aluminide coatings for gas turbine engine blades and components and to a method of introducing alloying elements to a surface region of an alloy.

BACKGROUND OF THE INVENTION

Increased turbine engine performance has been achieved through the improvements to turbine alloys, cooling scheme, and coatings. The most improvement from coatings has been through the addition of thermal barrier coatings (TBC) to cooled turbine components. For turbine blades, the most effective TBC has been applied by Electron Beam Physical Vapor Deposition (PVD). Prior art includes NiCoCrAlY, aluminide and platinum-aluminide bond coats. Evolutionary improvements to these bond coats has been realized in terms of optimal processing to produce improved surface finish or clean processing to reduce the significant effect of contaminates such as S (sulfur). However, turbine designers are not making full use of TBCs because their predicted life does not meet the component design life at higher turbine temperature or TBC life at existing temperatures are not reliable. Consequently a need for more reliable and longer life TBCs exists.

Addition of Hf to alloys is relatively easy and has shown a significant impact on TBC spallation life when high Hf alloys [higher than single crystal alloys (SXL) specification or directional solidification (DS) alloys with high Hf for improved castability] are coated with current outward type Pt—Al aluminide bond coats. SXL alloys have shown 3× to 5× (3 times to 5 times) life improvement while DS MarM247 has been reported to have 10× life improvement relative to baseline SXL TBC life. For SXL, the high Hf additions impacted SXL alloy microstructure and mechanical properties negatively.

SUMMARY OF THE INVENTION

The present invention provides a Pt—Al—X aluminide coating (X is Hf and/or Zr) that can be used beneath a TBC and improve TBC spallation life in service at elevated temperatures. In an embodiment of the invention, the Pt—Al—X aluminide coating includes a metastable (transitional) X—Pt/Pd—Ni phase where X is Hf and/or Zr; Pt/Pd means Pt or Pd or both are present in the phase; and where the Ni is present alone or with other alloying elements, in a β (Ni, Pt)Al outer phase of the coating. For brevity the ternary or higher X—Pt/Pd—Ni phase will be termed "µ phase". The metastable µ phase is present and observable in the early formation stages of coating development. The µ phase can be observed in as-deposited condition of the coating; e.g. in an as-CVD deposited condition of the coating, depending on parameters employed.

In an illustrative embodiment of the invention, a Pt—Al—Hf aluminide bond coating comprises a Pt concentration of about 18 atomic % across a coating thickness region straddling the $Hf_2Pt_3Ni_z$ µ phase from one side to the other. The bond coating has an Al concentration of about 31 to about 40 atomic %, such as about 35 to about 40 atomic % in certain embodiments, at the same thickness region straddling the $Hf_2Pt_3Ni_z$ µ phase from one side to the other. The bond coating has an Hf concentration of about 0.25 to about 1.0 atomic % across the same thickness region straddling the $Hf_2Pt_3Ni_z$ µ phase from one side to the other. The overall bond coating thickness is in the range of about 25 to about 45 microns, typically about 30 to about 40 microns.

The present invention provides a Pt—Al—X bond coating where X is Hf and/or Zr that can be used beneath a TBC and improve TBC spallation life in service at elevated temperatures. In an embodiment of the invention, the Pt—Al—X aluminide bond coating includes an outer coating surface where the Pt content is about 2 to about 16 atomic %, such as about 10 to about 16 atomic % in certain embodiments, and where the Al content is about 31 to about 40 atomic %, such as about 35 to about 40 atomic % in certain embodiments, and has an overall coating thickness of about 25 to about 45 microns, such as typically about 30 to about 40 microns where the overall coating thickness includes the diffusion zone and outer additive region. This embodiment may not have the above µ phase present in the coating microstructure in the event the coating is subjected to aluminizing times/temperatures or subsequent thermal exposures causing the metastable phase to dissolve.

The present invention also provides a method comprising introducing an intermediate element (e.g. Pt and/or Pd) on or in a surface region of an alloy substrate having a low solubility for another alloying element (e.g. Hf and/or Zr) followed by introducing said another alloying element in the intermediate element (e.g. Pt and/or Pd) under deposition conditions to form a surface region of the substrate that is enriched in said intermediate element and said another element.

BRIEF DESCRIPTION OF THE DRAWINGS

FIGS. 1(a) and 1(b) are Pd—Hf and Pt—Zr phase diagrams, respectively.

DETAILED DESCRIPTION OF THE INVENTION

Figure 2:
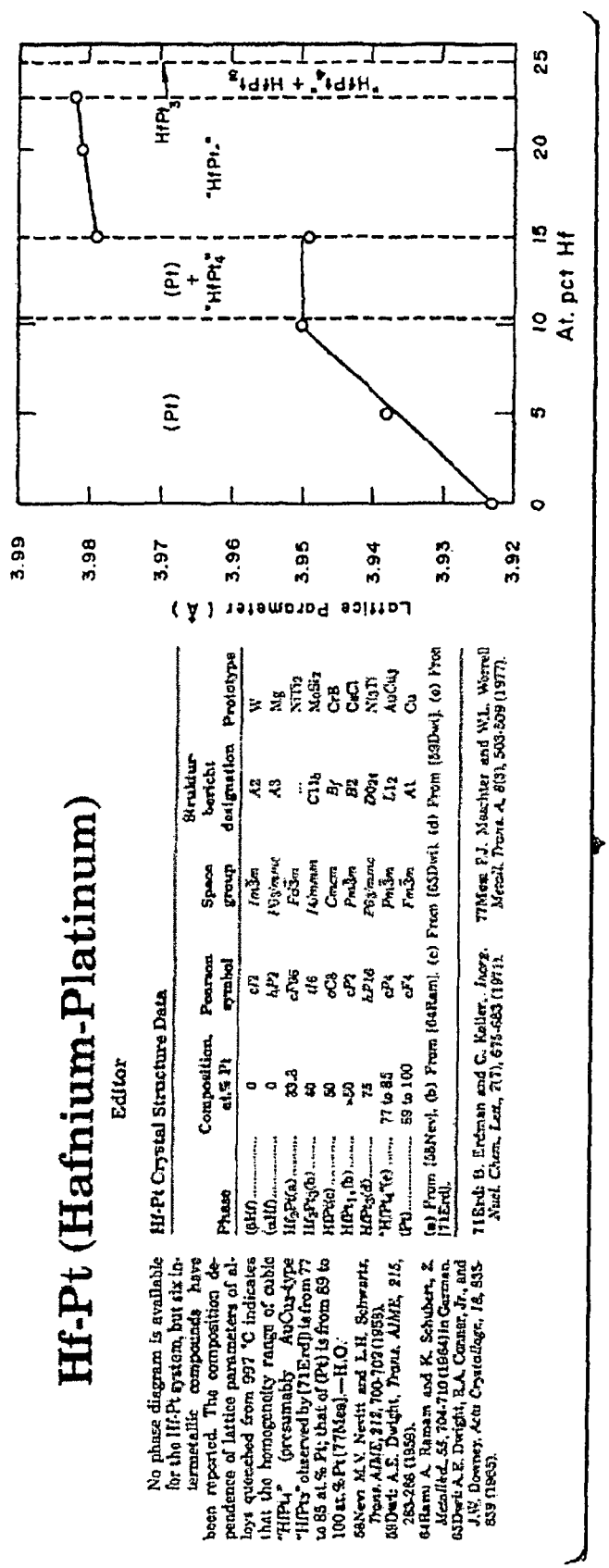
FIG. 2 is partial phase diagram information of the Hf—Pt system.

For purposes of illustration, the Pt—Al—X coatings where X is Hf and/or Zr will be described with respect to chemical vapor deposition (CVD) aluminide diffusion coatings where changes or modifications to conventional CVD coating parameters (U.S. Pat. No. 5,788,823) employed to form outwardly grown aluminide diffusion coatings were made as follows. The first and second changes are interelated and involve making the aluminide bond coating thinner and leaner in Al content. For example, the coating thickness can be about 30 to about 40 microns where the coating thickness includes the coating affected zone, diffusion zone and the additive region. In Al lean NiAl, the Ni diffuses about 3-5 times faster than the Al. This is the basis for the outward type aluminizing process. This phenomenon continues with additional time at temperature after the coating process is complete. In either case, the higher flux of Ni diffusing outward causes the NiAl to swell and generates a diffusion related strain that contributes to the rumpling phenomenon observed on many aluminide coatings. (The biggest strain contribution to rumpling is from the coefficient of thermal expansion mismatch between the γ/γ' alloy and the β NiAl. But the swelling phenomenon also contributes.) The higher the Al content, the more Ni is needed from the substrate to reach the steady state Al content of 30-32 atomic % and the more swelling of the NiAl. A thinner and leaner Al content bond coating will require less Ni diffusion from the alloy during formation of the coating and during high temperature service exposure. Starting with a thinner, lower Al content coating according to the invention, will allow the coating system to reach 30-32% Al concentration (the steady state Al content with gamma prime (γ')) with less Ni transport and less strain to contribute to the rumpling phenomenon that leads to early TBC spallation.

The third change is a higher surface Pt content in the bond coating of the invention. Again, coating time can alter this. The Pt is plated onto the alloy substrate surface prior to aluminization as described in U.S. Pat. No. 5,788,823. Pt is substitutional with Ni in the γ, γ' and β phases of the Ni—Al system. The Pt distribution in commercial production MDC-150L coating is bell shaped with about ½ of the Pt diffusing with Ni to form the additive layer of the coating and about ½ diffusing into the diffusion zone toward the alloy.

When plated with 10 mg/cm² Pt, commercial production coating times produce a coating outer surface Pt content in the range of 4-8 atomic %. By coating for short times (e.g. 540 minutes or less) pursuant to the invention, the thinner coating of the invention results in higher Pt content at the outer surface of the bond coating. For best TBC spallation results (i.e. prolongation of spallation life of TBC), the Pt content at the outer surface of the bond coating of the invention is in the range of about 10 to about 16 atomic %, which is higher due to less time (e.g. 210 minutes or less coating time) for Pt to be diluted by Ni diffusion from the substrate. Additionally, more Pt content can be provided at the outer surface if desired by plating a greater amount of Pt on the substrate before CVD aluminizing.

Lastly, co-deposition or sequential deposition of Hf (and/or Zr) with the Al to form the coating allows for Hf (and/or Zr) to become incorporated into the β (Ni,Pt)Al outer coating phase. Various explanations of the beneficial effects of reactive elements (Hf, Y, La, Ce, Er) on Ni based material oxidation have been reported in addition to the effect Hf has on TBC spallation life. But the addition to β (Ni,Pt)Al phase at significant levels is also difficult to achieve in a CVD, Above the Pack, or a pack coating environment. Consequently, an embodiment of this invention is a modified CVD process that produces substantial Hf (and/or Zr) incorporation into the β (Ni,Pt)Al outer coating phase via the formation of an $Hf_2Pt_3Ni_z$ metastable (transition) μ phase. In this case $Ni_z$ is nickel plus possible other elements in the alloy system to provide ternary, quaternary and higher alloys present in the β (Ni,Pt)Al phase. For example, for $Ni_z$, *z can be 5 when only Ni is present and is less than 5 when the metastable phase includes other alloying elements present in the alloy system in the β (Ni,Pt)Al coating phase (e.g. $Ni_{5-z}$ where *z is/are other alloying elements in atomic % present in the phase). When Pd plating is used in lieu of Pt plating, another embodiment provides a modified CVD process that produces substantial Hf (and/or Zr) incorporation into the β(Ni,Pd)Al coating phase via the formation of an $HfPdNi_z$ metastable ternary or higher μphase where *z can be 4 when only Ni is present and is less than 4 when the ternary or higher phase includes other alloying elements present in the alloy system in the β(Ni,Pd)Al coating phase (e.g. $Ni_{4-y}$ where y is/are other alloying elements in atomic % present in the phase).

One embodiment of the Pt—Al—X bond coats pursuant to the invention are unique in that the bond coat includes an outer coating surface where the Pt content is about 2 to about 16 atomic %, preferably about 10 to about 16 atomic %, and where the Al content is about 31 to about 40 atomic %, preferably about 35 to about 40 atomic % and has a coating overall thickness of about 25 to about 45 microns, typically about 30 to about 40 microns, where the coating overall thickness includes the coating affected zone, diffusion zone and additive β (Ni,Pt)Al region. This embodiment may not have the above μ phase present in the coating microstructure in the event the coating is subjected to subsequent the longer alumizing cycles, e.g. greater than 120 minutes, or post aluminizing thermal exposures causing the metastable phase to dissolve.

Another embodiment of the Pt—Al—X bond coats pursuant to the invention is unique in that the bond coat includes the μ phase in the mid-region of the coating (e.g. within the middle 40 to 60% of the as-deposited coating thickness) that is thought to be the position of the Pt plating prior to CVD aluminizing/hafnizing. The presence of the Pt is critical for Hf/Zr uptake from the CVD coating gas environment and the ability of the β (Ni,Pt)Al phase to hold significant levels of Hf and/or Zr in solid solution. The bond coat pursuant to the invention is capable of increasing the TBC spallation life at least 2× (two times) and potentially 3× longer than the commercial production MDC-150L coating (see U.S. Pat. No. 5,788,823). This invention can be practiced using the same basic processing equipment as the commercial production MDC-150L coating (U.S. Pat. No. 6,793,966 without gas inlet preheater 52) for purposes of illustration and not limitation. Practice of a method embodiment of the invention that involves depositing the Hf before the Al to charge the Pt-rich surface with Hf before Al deposition may improve uniformity of Hf deposition and allow use of other coating gas distribution conduits in practice of the invention. Moreover, another method embodiment of the invention envisions using a CVD Hf coating gas generator and setting of the coat temperature below the above-the-pack activator reaction temperature to charge the Pt rich surface with Hf, and then raising the coat temperature to above the activator reaction temperature to start aluminizing.

Examination of a series of phase diagrams provides insight into the concept of this invention. FIGS. 1(a) and 1(b) show published phase diagrams of the Pd—Hf and Pt—Zr binary alloy systems {Ref: Binary Alloy Phase Diagram $2^{nd}$ Edition, ASM International, 1990}. FIG. 2 shows published information of the Pt—Hf binary alloy system. By virtue of their location on the Periodic Table of Elements, Pd is above Pt and Zr is above Hf in their respective columns, these respective element pairs have similar properties. FIG. 1(a) shows that at 1080 C (degrees C.), Pd can hold more than 20 at.% of Hf in solid solution. Similarly, FIG. 1(b) shows that Pt can hold more than 20 at.% Zr in solid solution. Limited data on Pt—Hf suggested that Pt could hold up to 10 at.% in solid solution with the existence of an $HfPt_4$ phase. The FIG. 1 diagrams do not show an $HfPd_4$ or $HfZr_4$ phase. Consequently there is not complete agreement between the phase stability information as to the maximum solid solution solubility of Hf in Pt. Nonetheless, the data suggest that there is at least 10 at.% solid solution solubility which is more than enough to provide Hf/Zr doping of the bond coat surface in preparation for bond coat formation and TBC application. Hf doping to the 0.05% to 1% in (Ni,Pt)Al bond coats can be sufficient to improve TBC spallation life.

The invention uses the high Hf/Zr solubility in Pt to charge the alloy surface (substrate) with Hf/Zr. By Pt plating the Ni based alloy substrate, the substrate surface is very rich in Pt and provides the opportunity for Hf/Zr to be introduced into the Pt rich surface at high dopant levels. To prove this point, a Chemical Vapor Deposition experiment was conducted that utilized only $HfCl_4$ coating gas.

The experiment applied 10 mg/cm$^2$ Pt (U.S. Pat. No. 5,788, 823) to the surface of a commercially available single crystal Ni-based superalloy (CMSX-4®) 1-inch diameter x 0.125 inch thick coupons. The coupons were suspended in a CVD reactor (similar to that of U.S. Pat. No. 6,793,966 without gas inlet preheater 52). The CVD reactor was thermally ramped to 1080 C under a gas mixture of $H_2$/12.7 volume % Ar at 200 torr. During the thermal ramp, the Pt plate and the Ni superalloy begin to interdiffuse. Once the reactor is at 1080 C, HCl gas is fed into the Hf generator (U.S. Pat. Nos. 6,291,014; 6,793,966; and 6,689,422) to create a coating gas mixture of $H_2$/12.6 volume % Ar/0.14 volume % $HfCl_4$ in the coating retort. The Hf deposition portion of the coating cycle was held constant for 25 minutes. Then the retort was cooled and the samples removed for examination.

Figure 3B:
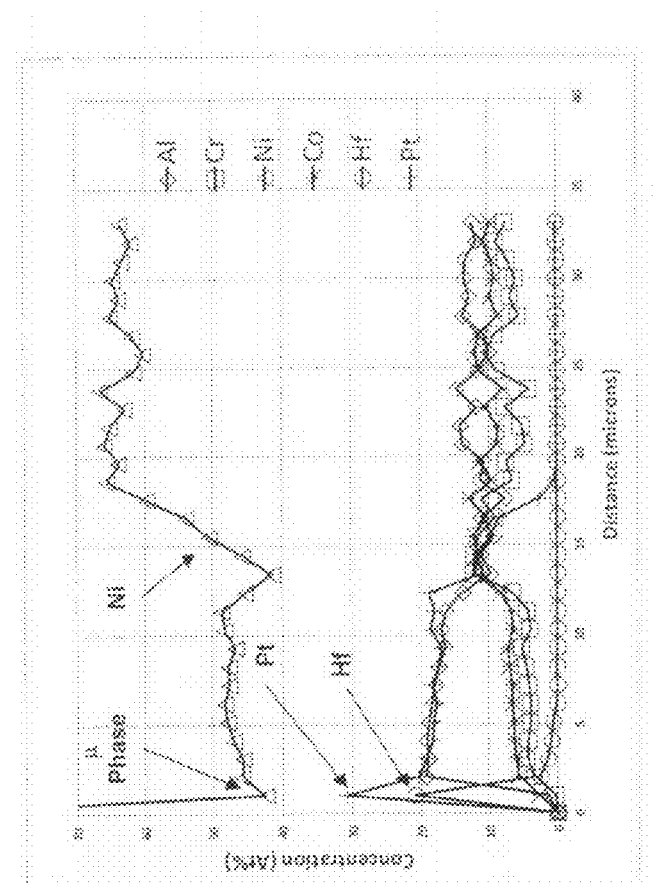
FIG. 3(b) shows the composition profile of CVD Hf on Pt plated Ni base superalloy.
Figure 3A:
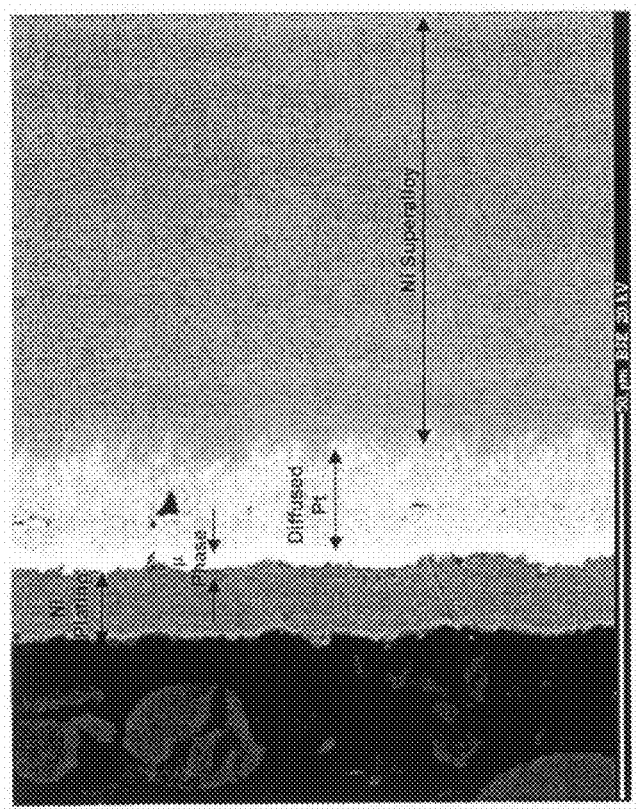
FIG. 3(a) is an SEM backscattered image of CVD Hf on Pt plated Ni base superalloy.

FIG. 3a shows a scanning electron microscope back scatter image and FIG. 3b shows the composition profile of the resultant coating. The formation of a high atomic number rich layer is clear by the strong brightness of the near surface. The composition profile, FIG. 3(b) confirms that the surface is enriched in Hf and the $Hf_2Pt_3Ni_z$ μ phase is present prior to any aluminization processing. In this case $Ni_z$ is nickel plus possible other substrate elements. In this case, other substrate elements in the μ phase are Co, Ta, Cr, and Al. When combined, the other substrate elements comprised about 6.5 atomic % of the phase.

Figure 4B:
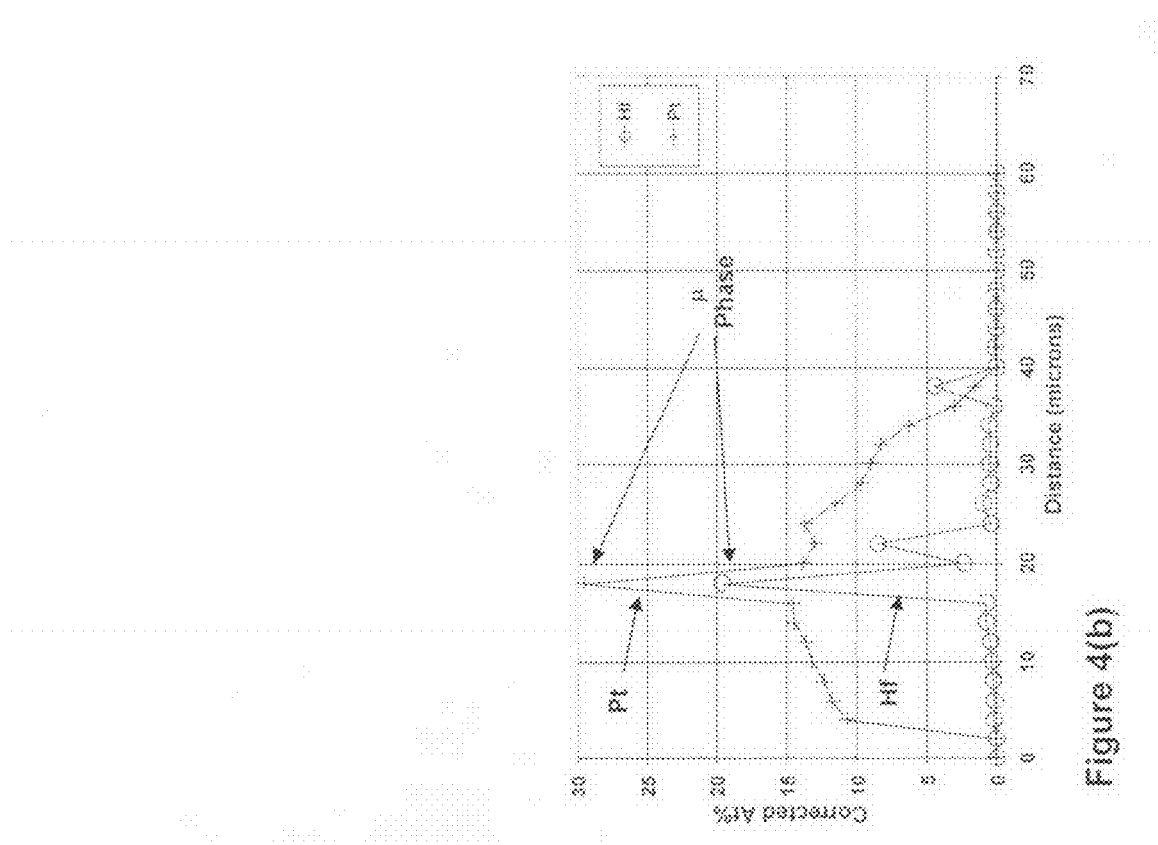
FIG. 4(b) shows the composition profile of CVD Hf and Pt only showing 20% to 30% Hf to Pt ratio.
Figure 4A:
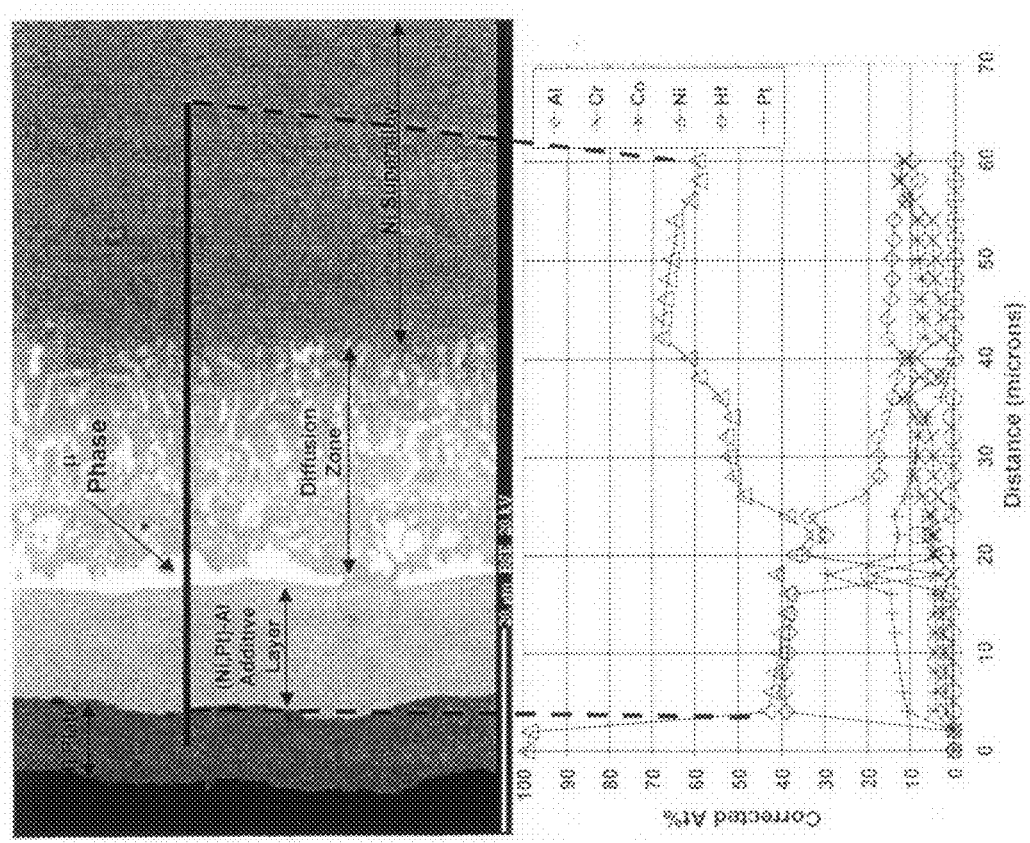
FIG. 4(a) is an SEM backscattered image of CVD Hf plus Al on Pt plated Ni base superalloy and a corresponding composition profile of the coated surface region.

A second experiment was performed using the same process as described above except the Hf only portion was increased to 45 minutes and the $HfCl_4$ was increased to 0.16 volume % and the Ar to 15.0 volume % and also the $AlCl_3$ portion was added after the 45 minutes. The combined $HfCl_4$ and $AlCl_3$ gas mixture flowed for 165 more minutes for a total coating cycle of 210 minutes. The combined coating gas mixture comprised $H_2$/13.6 volume % Ar/0.15 volume % $HfCl_4$, and 0.8 volume % $AlCl_3$. FIGS. 4a and 4b show the coating and Hf and Pt composition profile made from this process. With the additional formation of the additive layer of the outward type diffusion aluminide processing, the β (Ni, Pt)Al coating phase has formed over the μ phase. Ni and Pt must be able to transport through the μ phase and react with the $AlCl_3$ to form the β phase. Also the μ phase has changed shape. The irregular outer surface of the μ phase (adjacent the Ni plating) in FIG. 3a is smooth in FIG. 4a. The smooth inner surface of μ phase in FIG. 3a is irregular in FIG. 4a. The continuous μ phase in FIG. 3a has gaps in FIG. 4a. These changes suggest that Ni, Pt, and Hf from the FIG. 3a μ phase are diffusing. The outer surface is dissolving and becoming smooth as the additive layer forms. The inner surface is growing towards the diffusion zone in an irregular fashion. If the local chemical conditions are correct, the μ phase dissolves to form the gaps.

Figure 5:
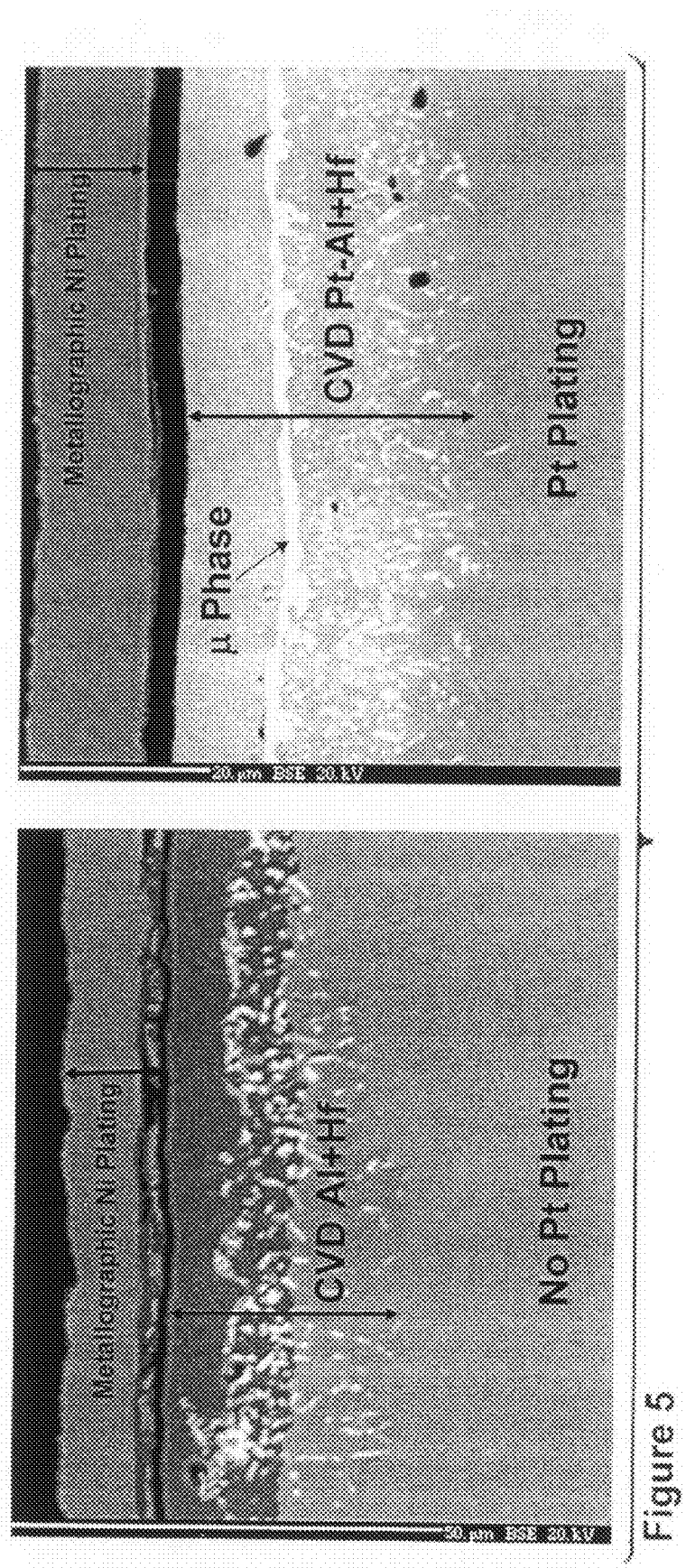
FIG. 5 shows results from samples of experiment 3 showing the formation of the β phase with Pt plated sample and no β phase without Pt plating.
Figure 6:
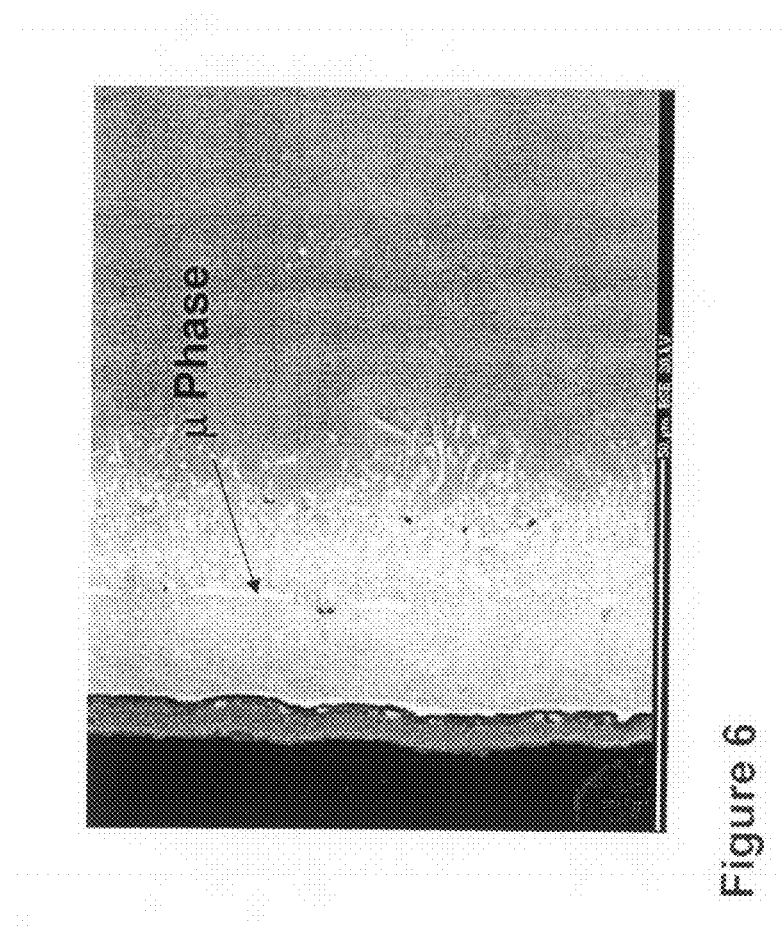
FIG. 6 is an SEM image of a sample of experiment 4 with higher $AlCl_3$ than experiment 3.

Experiments three and four were performed using the same process as experiment 2 except the Hf and Al coating gases were activated at the same time once the retort was at 1080 C and the coating gas was changed to $H_2$/12.6 vol. % Ar/0.2 vol. % $AlCl_3$/0.14 vol. % $HfCl_4$ for experiment 3 and $H_2$/12.6 vol. % Ar/0.4 vol. % $AlCl_3$/0.14 vol. % $HfCl_4$ for experiment 4. The total coating time remained at 210 minutes for both experiments. In addition to the Pt plated coupons, non-Pt plated coupons were also added to experiment 4 to understand the criticality of Pt at the surface in such a process. FIGS. 5 and 6 show the coatings resulting from these processing. The Pt plated samples have similar characteristics to experiment 2 while the non-Pt plated sample has no μ phase.

A general trend is also noted in that, as the $AlCl_3$ content of the coating gas is increased, less of the μ phase is observed. In experiment 2, initially there is only Hf available and the μ phase is readily visible in the microstructure. As Al availability increases in experiments 3 and 4; it competes with Hf for reaction with the Pt modified surface and less μ phase is observed.

Figure 7:
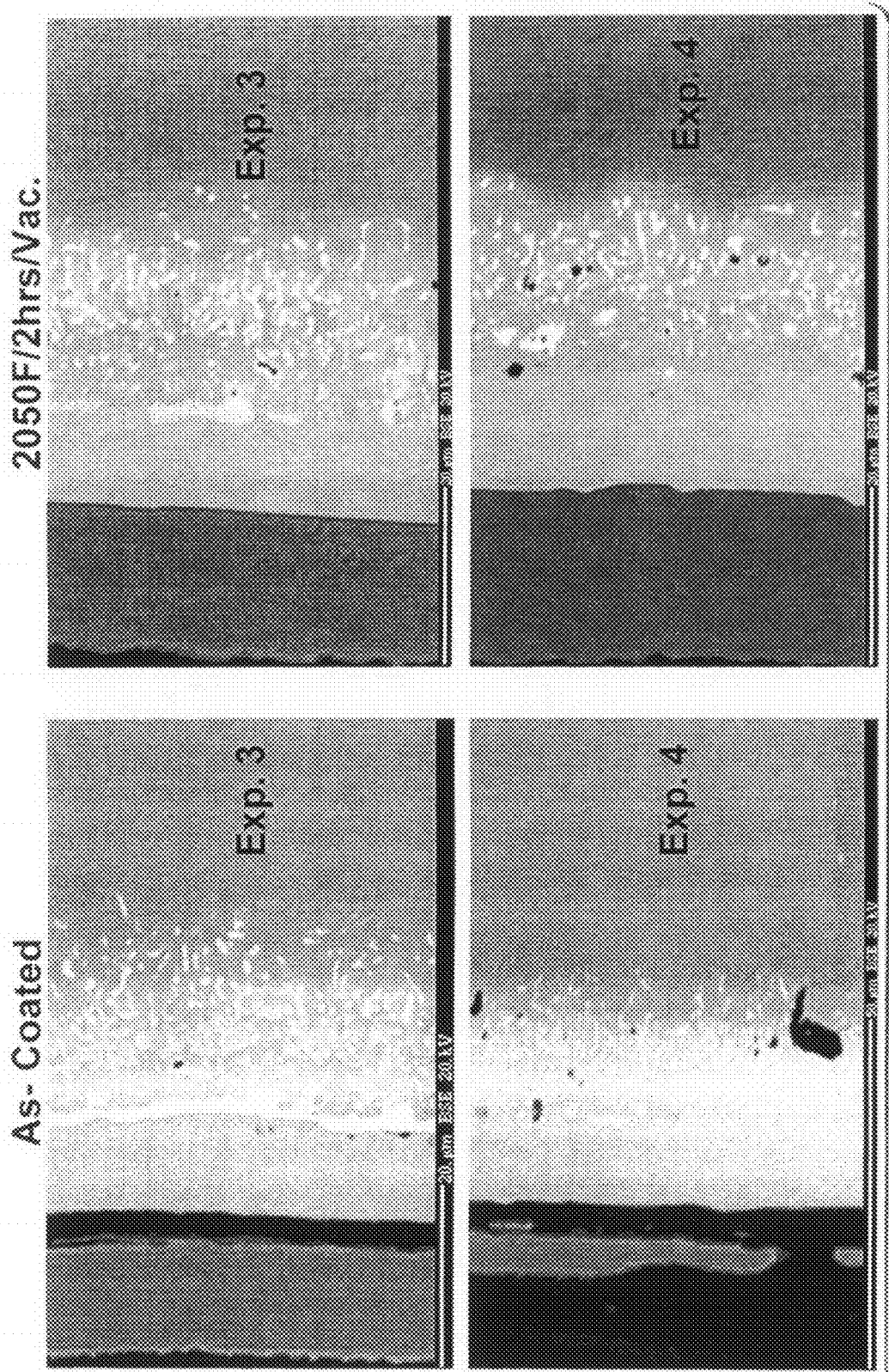
FIG. 7 contains SEM images of samples of experiments 3 and 4 before (as-coated) and after heat treatment at 2050 degrees F. for 2 hours in vacuum.

Remnant samples from experiments 3 and 4 were heat treated at 2050 F (degrees F.) for 2 hours in a vacuum. FIG. 7 illustrates how the μ initial phase is altered by this heat treatment showing that the μ phase is metastable and will dissolve with time at temperature. The bright μ phase of experiment 3 is diminished to a ghost image of a lesser amount of μ phase after heat treatment. The minimal amount of μ phase in the experiment 4 sample is completely dissolved.

Figure 8:
FIG. 8 is an SEM image of a sample of experiment 5 showing no evidence of the β phase.

A fifth experiment to show the metastable nature of the μ phase was conducted using the same parameters as experiment 4 except the $AlCl_3$ was increased to 0.8 vol. % and the coating time was extended to 420 minutes. As shown in FIG. 8, the higher coating gas $AlCl_3$ content and longer coating time reduce the amount the μ phase to the point it is not distinguishable.

Figure 9:
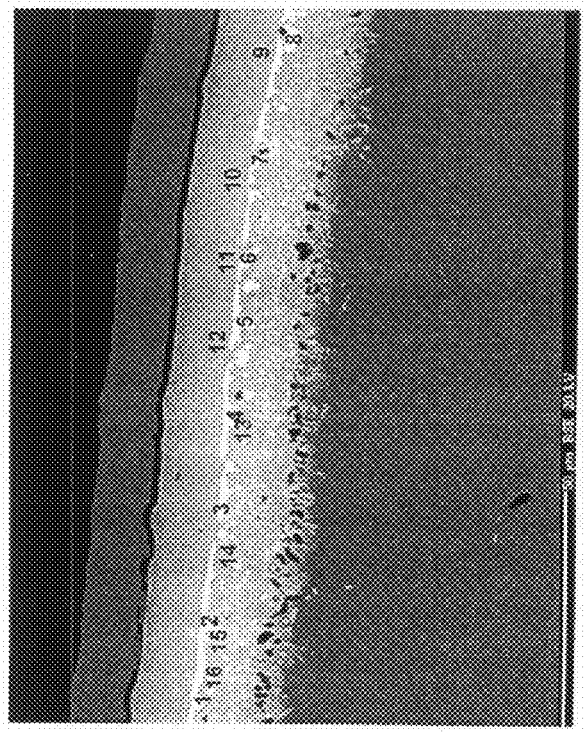
FIG. 9 shows spot analyses of sample of experiment 3 with substantial Hf in (Ni,Pt)Al β phase.

An objective of the invention is to provide a method to add Hf (and/or Zr) to the (Ni,Pt)—Al bond coat. In particular, Hf enrichment of the additive layer of the bond coat that forms the thermally grown oxide to which the thermal barrier coating is anchored. Work with ternary Ni—Al—Hf systems suggests that there is very low solubility for Hf in the Ni—Al β phase. However, the coating formed on a Ni superalloy forms with other elements from the superalloy allowing for subtle solubility changes. Additionally, Al lean, β—NiAl is a more defected crystal structure allowing for higher solubility of other elements. FIG. 9 shows a set of spot analyses of a sample made in experiment 3. The spots are divided into 3 groups. The outboard spots are in the β (Ni,Pt)Al coating regions above the μ phase and the inboard spots are in the β (Ni,Pt)Al coating regions below the μ phase. The Hf content of the inboard and outboard β (Ni,Pt)Al coating regions ranges between about 0.5 and about 1.0 atomic %.

With the above ability to charge up the Pt rich surface with Hf via the μ phase, the ultimate benefit of this invention is to improve the spallation life of the TBC. To demonstrate this, a baseline coating process (MDC-150L) and three versions of experiment 6 produced 156 bond coated spallation test coupons. The three versions of experiment 6 used the same coating cycle parameters of experiment 5 except for coating gas time. Experiment 6A used 120 minutes, 6B used 210 minutes, and 6C used 420 minutes, the same as experiment 5. To show the importance of Pt plating for Hf charging, Experiments 6A, 6B, and 6C had 4 coupons with no Pt plating. To minimize test biasing from the TBC deposition processing, the coupons were TBC coated in a series of runs with coupons from all four bond coat processes in each of the TBC coating cycles. The TBC (thermal barrier coating) comprising yttria-stabilized zirconia was applied following the process described in U.S. Pat. No. 5,716,720.

Table 3 set forth below is a summary of experimental processing parameters for the 6 experiments (exp.).

Cyclic Testing was performed in vertically mounted Lindberg Tube Furnaces with a suspended sample tree that drops the samples into the furnace for the exposure time and then elevates them to cool to near room temperature. The test cycle is 50 minutes in the furnace and 10 minutes of cooling. The test temperature is 2075 degrees F. Each Test Rig has automated controllers for conducting the testing around the clock. Before the start of the tests and at furnace service times, the furnace is surveyed to 2075 degrees F.±10 F.

Each test is run for 20 cycles and allowed to cool before resetting the counter for an additional 20 cycles. During the 4 hour hold period, the samples are inspected for failure. After 100 cycles, the samples are removed from the test rigs and held for the 4 hour holding period and inspected for failure. In each case, failure is defined as 20% of the face of the coupon having TBC spallation.

There are 4 Test Rigs with the above description. Each sample tree holds 40 coupons. Since only 40 can be tested at once, additional coupons are added as failed coupons are removed from the test.

Figure 10:
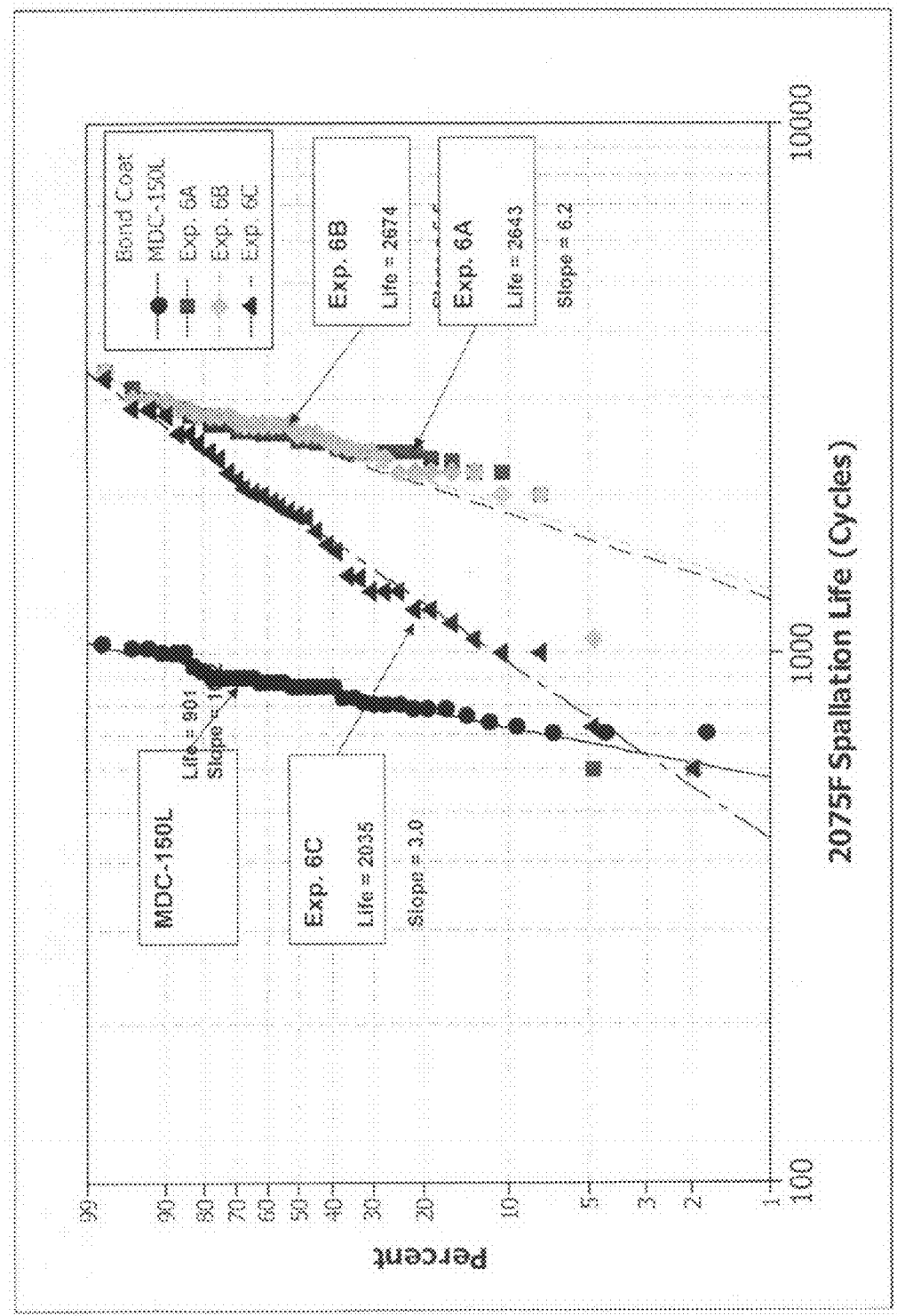
FIG. 10 is a Wellbull plot of baseline commercial outward type Pt—Al coating (MDC-150L) and experiment 6 variants.

FIG. 10 shows results of the TBC spallation testing of the four bond coats. The graph is a Weibull plot were the y-axis is a Cumulative % Failure following the formula:

Failure=$(R-0.3)/(N+0.4)*100$

R=Failure Rank (1, 2, 3, 4, . . . )
N=Total Number of Failures

The x-axis is the cyclic spallation cycles at failure for the corresponding rank of failure.

Each data set has a Characteristic Life, which is the Cumulative % Failure at 63.2%, and a shape parameter, which is the slope of the data set. For TBC spallation life, extending Characteristic Life and/or increasing the slope are desirable qualities.

From FIG. 10 and Table 2 set forth below, it is clear that all 3 versions of Experiment 6 show a substantial improvement over the commercial production MDC-150L baseline (901 cycles). The longer time Experiment 6C showed the least improvement with a characteristic life of 2035 cycles while the shorter time Experiments 6A and 6B showed characteristic lives of 2643 and 2674 respectively. The slopes of the Experiment 6 versions are not as steep as the MDC-150L baseline with the longer 6C Experiment having the poorest slope. The effect of bond coating time on TBC spallation life is perhaps explained by the loss of Hf due to more diffusion of Hf into the superalloy and away from the TBC/TGO interface, although applicant does not wish or intend to be bound by any theory or explanation in this regard. There appears to be an optimal coating time to achieve maximum TBC spallation life.

Table 2 includes data from Experiments 6A, 6B, and 6C where the Pt plating was not applied to a subset of the samples. This data clearly shows that these samples performed below the baseline MDC-150L characteristic life reinforcing the need for a Pt rich surface to dissolve and retain Hf in the bond coat.

The above examples show how manipulation of CVD processing parameters can affect the concentration and distribution of Hf in the bond coatings and hence TBC spallation life. The CVD process methodology gives extra degrees of freedom versus pack or above-the-pack coating processing where all constituents must be introduced into the coating environment as the same time. CVD processing allows for control of when and for how long each gas species is present in the coating environment. The above experiments represent a sampling of these possibilities and do not restrict the invention to only those mentioned.

Another embodiment of the present invention involves forming the bond coating as described above yet using a lesser amount of the applied Pt (or Pd) electroplated layer before aluminization. For example, the above embodiments of the invention employed an initial Pt electroplated layer having 10 mg/cm$^2$ Pt on the sample surface. The following examples employ various lesser amounts of the Pt layer; namely, no Pt, 2 mg/cm$^2$ Pt layer, 4 mg/cm$^2$ Pt layer, 6 mg/cm$^2$ Pt layer, and 8 mg/cm$^2$ Pt. These samples plus the earlier standard of 10 mg/cm$^2$ were then aluminized according to Experiment 6B described above to form the bond coat on the Pt plated substrate.

Figure 11:
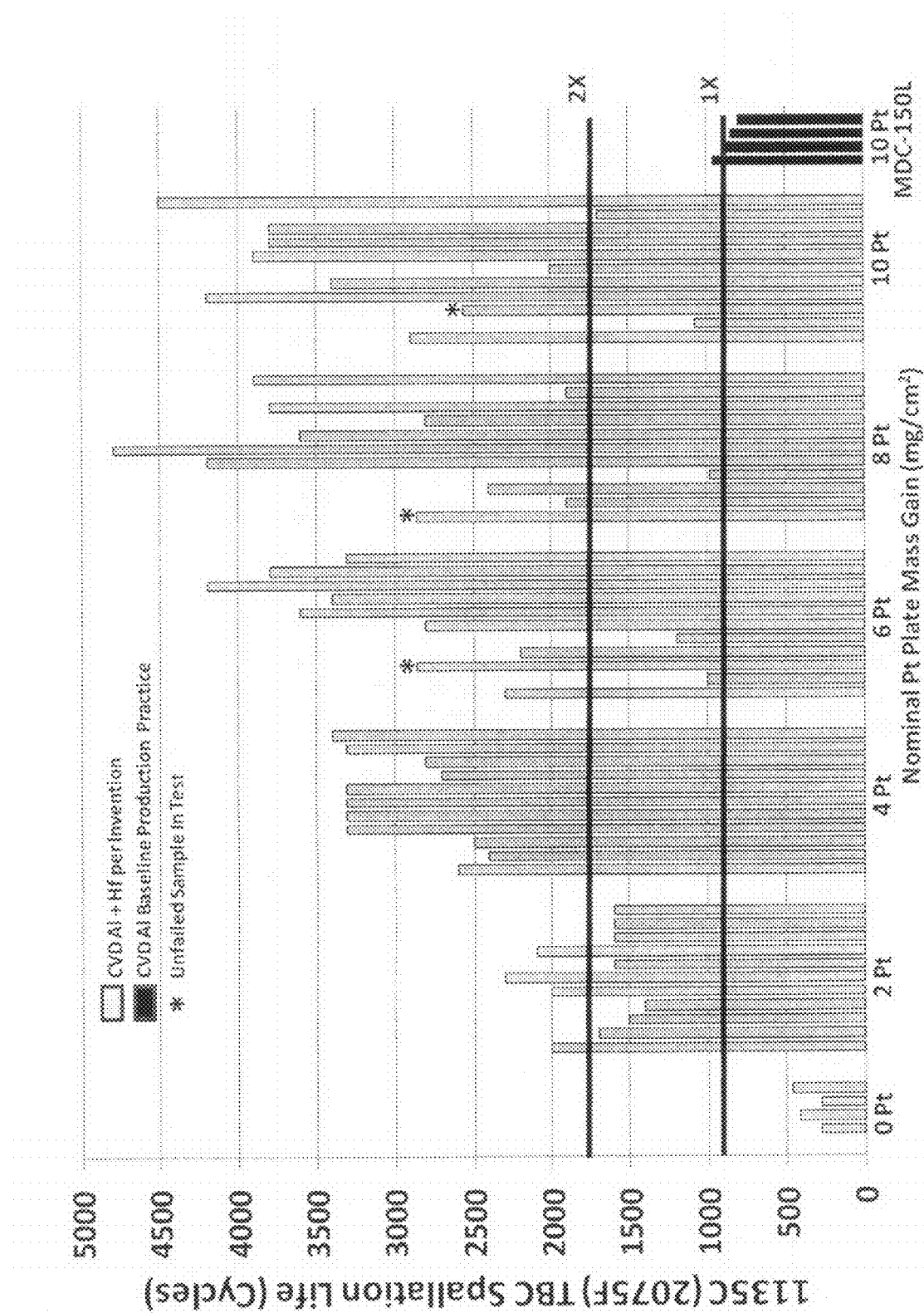
FIG. 11 is a bar graph showing spallation life in cyclic oxidation testing (at 1135 C) of TBC samples having bond coats made pursuant to a method embodiment using different surface amounts of a Pt layer electroplated on the samples, No Pt layer, 2 mg/cm² Pt layer, a 4 mg/cm² Pt layer, a 6 mg/cm² Pt layer, and a 8 mg/cm² Pt layer before bond coating aluminization and hafnization. The samples are compared to similar samples that were made using 10 mg/cm² Pt layer electroplated on the samples before bond coating aluminization and hafnization. The samples also are compared to baseline TBC-coated MDC-150L samples having a 10 mg/cm² Pt layer with standard production aluminizing time and thus is representative of a commercial production coating.

Referring to FIG. 11, a bar graph is provided showing spallation life in cyclic oxidation testing (1135 C) of TBC samples (as described above) having bond coats made using the different surface amounts of the Pt layer electroplated on the samples before bond coating (aluminization+hafnization). The samples designated 0 Pt, 2 Pt, 4 Pt, 6 Pt and 8 Pt are compared to similar samples designated 10 Pt and 10 Pt MDC-150L, The grey bars were bond coated using the Exp. 6B parameters (aluminization+hafnization) while the black bars, baseline MDC-150L, coating was aluminized per the production practice. Note that 3 samples had not failed at this point in the testing.

FIG. 11 reveals that as the amount of the Pt electroplated layer on the sample surface is increased from 0 mg/cm$^2$ Pt to 10 mg/cm$^2$ Pt, the spallation life is substantially improved, on average, as compared to average spallation life of the baseline TBC-coated MDC-150L samples. Moreover, FIG. 11 reveals that a lesser amount of the Pt electroplated layer can be used and still provide a spallation life that is equivalent or better than the spallation life provided by the TBC-coated MDC-150L samples representative of a commercial production coating. This embodiment permits a reduction in the amount of Pt (or Pd) used as a result of the presence of Hf and/or Zr in the coating in effective amount to achieve oxidation resistance substantially equivalent to that of MDC-150L commercial coating. This embodiment with reduced Pt layer amounts can be employed in making of the bond coat and thus achieve substantial reduction in materials cost to make the bond coat wherein the bond coat will provide TBC spallation life in cyclic oxidation testing as good as or better than that of MDC-150L commercial coating.

TABLE 2

| Bond Coat | Pt (gm/cms$^2$) | Characteristic Life | Slope |
|---|---|---|---|
| MDC-150L | 10 | 901 | 10.2 |
| Exp 6A | 10 | 2643 | 6.2 |
| " | 0 | 455 | 3.0 |
| Exp. 6B | 10 | 2674 | 6.5 |
| " | 0 | 393 | 5.1 |
| Exp 6C | 10 | 2035 | 3.0 |
| " | 0 | 358 | 10.2 |

TABLE 3

| Exp. | Cycle | Time | Coating Retort Gas Volume Percent | | | |
|---|---|---|---|---|---|---|
| | | | H2 | AlCl3 | HfCl4 | Ar |
| 1 | 2690 | 25 | 85 | 0 | 0.17 | 15.2 |
| 2 | 2335 Hf | 45 | 85 | 0 | 0.16 | 14.9 |
| " | 2335 Al + Hf | 165 | 85 | 0.9 | 0.15 | 13.6 |
| 3 | 2209 | 210 | 87 | 0.2 | 0.14 | 12.6 |
| 4 | 2229 | 210 | 87 | 0.4 | 0.14 | 12.6 |
| 5 | 2414 | 420 | 86 | 0.8 | 0.14 | 12.6 |
| 6A | 2399 | 120 | 86 | 0.8 | 0.14 | 12.6 |
| 6B | 2402 | 210 | 86 | 0.8 | 0.14 | 12.6 |
| 6C | 2414 | 420 | 86 | 0.8 | 0.14 | 12.6 |

Although the present invention has been described with respect to certain illustrative embodiments, those skilled in the art will appreciate that modifications and changes can be made therein within the scope of the invention as set forth in the appended claims.

The invention claimed is:

1. An aluminide diffusion coating on a substrate wherein the coating includes a non-aluminide X—Pt/Pd—Ni phase, wherein the phase comprises X, which is at least one of Hf and Zr, Pt/Pd, which is at least one of Pt and Pd, and Ni, and wherein the X—Pt/Pd—Ni phase is present as a layer between an outer β (Ni,Pt/Pd)Al phase region and an inner diffusion zone of the coating, wherein the outer β (Ni,Pt/Pd)Al phase region and the non-aluminide X—Pt/Pd—Ni phase are disposed outboard of the diffusion zone of the coating.

2. The coating of claim 1 wherein the X—Pt/Pd—Ni phase is present and observable in the as-deposited condition of the coating.

3. The coating of claim 1 wherein the phase is present and observable in as-CVD deposited condition of the coating.

4. The coating of claim 1 wherein the phase comprises $X_2Pt_3Ni_z$, where z is 5 or less.

5. The coating of claim 1 wherein the phase comprises $XPdNi_z$ where z is 4 or less.

6. The coating of claim 4 having a Pt concentration of about 18 atomic % in the outer β (Ni,Pt/Pd)Al phase region of the coating adjacent to the X—Pt/Pd—Ni phase.

7. The coating of claim 6 having an Al concentration of 31 to 40 atomic % in the outer β (Ni,Pt/Pd)Al phase region of the coating adjacent to the X—Pt/Pd—Ni phase.

8. The coating of claim 7 having an Al concentration of 35 to 40 atomic % in the outer β (Ni,Pt/Pd)Al phase region of the coating adjacent to the X—Pt/Pd—Ni phase.

9. The coating of claim 4 having an Hf concentration of about 0.25 to about 1.0 atomic % in at a location of the outer β (Ni,Pt/Pd)Al phase region that is adjacent to the X—Pt/Pd—Ni phase.

10. The coating of claim 9 having an Hf concentration of about 0.5 to about 1.0 atomic %.

11. A diffusion aluminized coating on a substrate wherein the coating includes an outer additive region having an outer coating surface where the Pt content is about 2 to about 16 atomic %, where the Al content is 31 to 40 atomic %, and where at least one of Hf and Zr is present, and wherein the coating has a highest concentration of at least one of Hf and Zr at a location adjacent to an inner diffusion zone of the coating, the coating having an overall coating tckness of about 25 to about 45 microns where the overall coating thickness includes the diffusion zone and the outer additive region.

12. The coating of claim 11 wherein the overall thickness is about 30 to about 40 microns.

13. The coating of claim 11 wherein the Pt content is about 10 to about 16 atomic %.

14. The coating of claim 11 wherein the Al content is 35 to 40 atomic %.

15. The coating of claim 11 including 0.25 to 1.0 atomic % of at least one of Hf and Zr at said location.

16. The coating of claim 11 wherein the outer additive region includes at least one of Hf and Zr diffused therein from an underlying precursor non-aluminide X—Pt/Pd—Ni phase layer, where X is at least one of Hf and Zr and Pt/Pd is at least one of Pt and Pd, that is located adjacent to the inner diffusion zone.

17. The coating of claim 11 wherein at least one of Hf and Zr are deposited from one coating gas species, and Al is deposited from another coating gas species, by diffusion aluminizing.

* * * * *